United States Patent
Huang et al.

(10) Patent No.: US 8,897,005 B2
(45) Date of Patent: Nov. 25, 2014

(54) ELECTRONIC APPARATUS

(75) Inventors: Yi-Ta Huang, New Taipei (TW);
Cheng-Nan Ling, New Taipei (TW);
Yan-Lin Kuo, New Taipei (TW)

(73) Assignee: Acer Incorporated, New Taipei (TW)

( * ) Notice: Subject to any disclaimer, the term of this patent is extended or adjusted under 35 U.S.C. 154(b) by 286 days.

(21) Appl. No.: 13/488,463

(22) Filed: Jun. 5, 2012

(65) Prior Publication Data

US 2013/0107465 A1    May 2, 2013

(30) Foreign Application Priority Data

Nov. 1, 2011  (TW) .............................. 100139838 A

(51) Int. Cl.
| | |
|---|---|
| G06F 1/16 | (2006.01) |
| H05K 5/00 | (2006.01) |
| H05K 7/00 | (2006.01) |
| H01R 13/44 | (2006.01) |
| H05K 7/16 | (2006.01) |

(52) U.S. Cl.
CPC ........ H05K 7/16 (2013.01); G06F 1/166 (2013.01); G06F 1/1675 (2013.01); G06F 1/1684 (2013.01)
USPC ............ 361/679.43; 361/679.27; 361/679.42; 361/725; 361/727; 361/679.01; 439/131

(58) Field of Classification Search
CPC .......... G06F 1/166; G06F 1/1684; H05K 7/16
USPC ............. 361/679.27, 679.12, 679.42–679.43, 361/725–727, 679.45; 439/131, 135, 139
See application file for complete search history.

(56) References Cited

U.S. PATENT DOCUMENTS

| | | | | |
|---|---|---|---|---|
| 5,634,802 | A * | 6/1997 | Kerklaan | 439/131 |
| 5,741,055 | A * | 4/1998 | Chen | 312/348.6 |
| 6,290,517 | B1 * | 9/2001 | Anderson | 439/131 |
| 6,510,051 | B2 * | 1/2003 | Kim | 361/679.43 |
| 6,637,846 | B2 * | 10/2003 | Yang | 312/223.2 |
| 6,643,139 | B2 * | 11/2003 | Tien | 361/727 |
| 6,978,903 | B2 * | 12/2005 | Son et al. | 211/26 |
| 6,980,422 | B2 * | 12/2005 | Bhogal | 361/679.55 |
| 7,140,904 | B2 * | 11/2006 | Carr et al. | 439/372 |
| 7,200,002 | B2 * | 4/2007 | Peng et al. | 361/679.4 |

(Continued)

FOREIGN PATENT DOCUMENTS

| | | |
|---|---|---|
| TW | M267522 | 6/2005 |
| TW | M403185 | 5/2011 |
| TW | M411598 | 9/2011 |

*Primary Examiner* — Jayprakash N Ganhi
*Assistant Examiner* — Abhishek Rathod
(74) *Attorney, Agent, or Firm* — Jianq Chyun IP Office

(57) ABSTRACT

An electronic apparatus including a first body, a second body, a connection port module and a pushing rod module is provided. The second body pivoted to the first body so that the second body is able to be opened and closed relative to the first body. The connection port module is movably disposed in the first body and has a pushing portion. The pushing rod module is disposed in the first body. A first end of the pushing rod module is coupled to the pushing portion, and a second end of the pushing rod module is coupled to the second body. When the second body spreads out relative to the first body, the second body drives the pushing portion by the pushing rod module so that the connection port module is exposed from the first body by moving relative to the first body.

12 Claims, 6 Drawing Sheets

(56) References Cited

U.S. PATENT DOCUMENTS

| | | | |
|---|---|---|---|
| 7,217,144 B1* | 5/2007 | Cipolla et al. | 439/131 |
| 7,452,220 B2* | 11/2008 | Reid et al. | 439/131 |
| 7,458,830 B2* | 12/2008 | Reid et al. | 439/131 |
| 7,916,466 B2* | 3/2011 | Cheng et al. | 361/679.4 |
| 8,568,151 B2* | 10/2013 | Cheng | 439/131 |
| 2003/0156387 A1* | 8/2003 | Shimizu | 361/726 |
| 2004/0184243 A1* | 9/2004 | Mease et al. | 361/725 |
| 2006/0112516 A1 | 6/2006 | Chen et al. | |
| 2008/0041358 A1* | 2/2008 | Yamauchi et al. | 126/198 |
| 2010/0251518 A1 | 10/2010 | Chiang | |
| 2011/0261519 A1* | 10/2011 | Chiu et al. | 361/679.02 |
| 2011/0273832 A1* | 11/2011 | Tracy et al. | 361/679.31 |
| 2013/0225001 A1* | 8/2013 | Chang et al. | 439/625 |

* cited by examiner

ELECTRONIC APPARATUS

CROSS-REFERENCE TO RELATED APPLICATION

This application claims the priority benefit of Taiwan application serial no. 100139838, filed on Nov. 1, 2011. The entirety of the above-mentioned patent application is hereby incorporated by reference herein and made a part of this specification.

BACKGROUND OF THE INVENTION

1. Field of the Invention

The invention is directed to an electronic apparatus and more particularly, to an electronic apparatus with a connection port module.

2. Description of Related Art

With the advancement in the computer technology, electronic apparatuses bring people more convenient life. Taking computer apparatus for example, the rapid processing efficiency thereof results in widespread usage. Among them, with the launch of notebook computers, the computer apparatus has become portable electronic apparatus, and a user can use the computer apparatus anytime and anywhere, without limitation of location. Generally, the computer apparatus has an input/output interface (I/O interface) configured for connecting with an external device. With the I/O interface, not only the computer apparatus can be connected with a peripheral equipment, but also the function of the computer apparatus can be expanded via the connection with the external devices.

However, as for a general type computer apparatus, particularly a notebook computer, the I/O interface thereof is usually exposed externally and installed in four sides of the notebook computer. Thereby, the exterior appearance is incongruous, and also dust or undesired objects are prone to enter into the connectors which thus, giving rise to problems, such as poor electrical contact.

Moreover, the way of disposing the I/O interface in the notebook computer also limits the development of the notebook computer toward being thinner. For example, since the I/O interface is commonly disposed at the side of the notebook computer and protrudingly disposed thereunder, and thus, the thickness of the housing must be larger than the thickness of the connector so as to completely cover the connector. In other words, the thickness of the side the notebook computer is at least equal to a sum of the thickness of the housing plusing the thickness capably of containing the I/O interface so that the I/O interface can be installed. Accordingly, especially as for the notebook-like computer apparatus, the existing disposement of the I/O interface directly hinders it from development of being thinner.

SUMMARY OF THE INVENTION

The invention is directed to an electronic apparatus, which includes a hidden connection port module capable of being opened and closed automatically.

According to one embodiment of the invention, an electronic apparatus is provided, which includes a first body, a second body, a connection port module and a pushing rod module. The second body is pivoted to the first body so that the second body is opened and closed relative to the first body. The connection port module is movably disposed in the first body. The connection port module has a first pushing portion. The pushing rod module is disposed in the first body. A first end of the pushing rod module is coupled to the first pushing portion. A second end of the pushing rod module is coupled to the second pushing portion. When the second body spreads out relative to the first body, the second body drives the first pushing portion by the pushing rod module so that the connection port module is exposed from the first body by moving relative to the first body.

According to one embodiment of the invention, an electronic apparatus is provided, which includes a first body, a second body and a connection port module. The second body is pivoted to the first body so that the second body is opened and closed relative to the first body. The connection port module is movably disposed in the first body. When the second body spreads out relative to the first body, the second body drives the connection port module to rotate relative to the first body so that the connection port module is overturned and exposed from the first body. A surface of the connection port module exposed from the first body is different from a surface of the first body covered by the second body when the second body is closed relative to the first body.

In one embodiment of the invention, the pushing rod module includes a pushing rod and a cam. The pushing rod is disposed in the first body and has the first end and the second end. The cam is disposed on where the second body is pivoted to the first body so as to rotate as the second body is opened and closed. The cam has a second pushing portion, and the second end is located on a moving path of the second pushing portion.

In one embodiment of the invention, the pushing rod is pivoted to the first body to form a lever structure. The first end and the second end are disposed on two opposite sides of the lever structure.

In one embodiment of the invention, the pushing rod is a magnetic dipole structure disposed in the first body and includes a first member and a second member. The first member is fixed in the first body. The second member is slidingly disposed in the first body and has the first end and the second end. The second member is magnetically equal to or opposite to the first body.

In one embodiment of the invention, the pushing rod module includes a bearing member and a plurality of connectors. The bearing member has the pushing portion, and a side of the bearing member is pivoted to the first body. The connectors are disposed on the bearing member.

In one embodiment of the invention, the connection port module has a connecting surface, and the bearing member has a side surface. When the second body is closed relative to the first body, the connecting surface is hidden in the first body, and the side surface is exposed from the first body. When the second body spreads out relative to the first body, the connecting surface and the side surface are exposed from the first body.

In one embodiment of the invention, the first body has a covering surface. When the second body is closed relative to the first body, the second body is stacked on the covering surface, and the side surface is adjacently connected with the covering surface. When the second body spreads out relative to the first body, the connecting surface is adjacently connected between the covering surface and the side surface.

In one embodiment of the invention, the first body is adapted to being placed on a platform. When the second body spreads out relative to the first body, the second body is propped against the platform so that a part of the first body is elevated relative to the platform, and the connection port module exposed from the first body is located between the first body and the platform.

To sum up, in the embodiments of the invention, the electronic apparatus drives the connection port module to be hidden in of exposed from the machine body as the machine bodies are opened or closed relative to each other. When not in use, the connection port module is stored in the machine body so that the machine body of the electronic apparatus can be beautified, and the appearance of the electronic apparatus becomes lighter and thinner. Moreover, exposing the connection port module from the machine body as the machine body spreads out in replacement with the manual operation in the related art can enhance the convenience of using the connection port module of the electronic apparatus.

In order to make the aforementioned and other features and advantages of the invention more comprehensible, embodiments accompanying figures are described in detail below.

DESCRIPTION OF EMBODIMENTS

Figure 1:
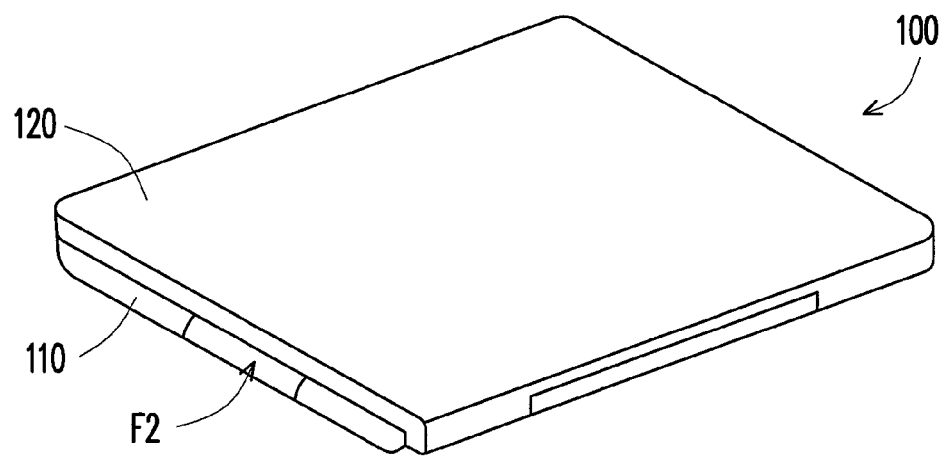
FIG. 1 is a schematic diagram of an electronic apparatus according to one embodiment of the invention.
Figure 2:
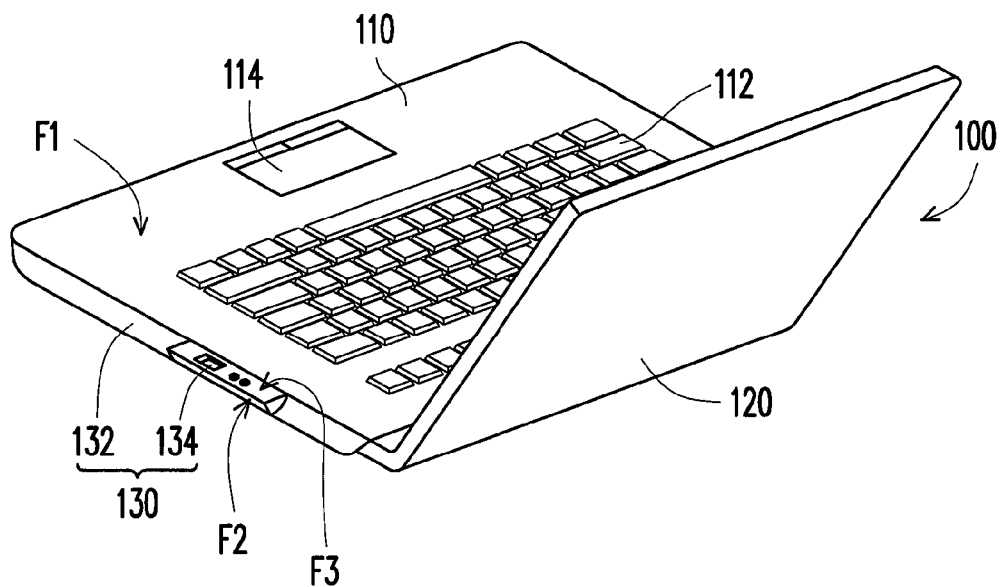
FIG. 2 is a schematic diagram showing the electronic apparatus depicted in FIG. 1A in a spreading status.

FIG. 1 is a schematic diagram of an electronic apparatus according to one embodiment of the invention. An electronic apparatus depicted therein is in a closed status. FIG. 2 is a schematic diagram showing the electronic apparatus depicted in FIG. 1 in a spreading status. Referring to both FIG. 1 and FIG. 2, in the present embodiment, an electronic apparatus 100 is, for example, a notebook computer, which includes a first body 110, a second body 120 and a connection port module 130. The first body 110 is, for example, a host of the notebook computer, and a keyboard 112 and a touch board 114 are disposed thereon. The second body 120 is, for example, a screen of the notebook computer and pivoted to the first body 110 so that the second body is opened and closed relative thereto. The connection port module 130 is constructed of a bearing member 132 and a plurality of connectors 134 (e.g., an audio jack, an universal serial bus, and so on), which is movably disposed in the first body 110. Herein, when the second body 120 is opened and closed relative to the first body 110, the second body 120 drives the connection port module 130 to rotate relative to the first body 110. For example, when the second body 120 spreads out relative to the first body 110, the second body 120 drives the connection port module 130 to overturn so as to be exposed from the first body 110. And, a surface of the connection port module 130 exposed from the first body 110 is different from a surface covered by the second body 120 when the second body 120 is closed relative to the first body 110.

Figure 3A:
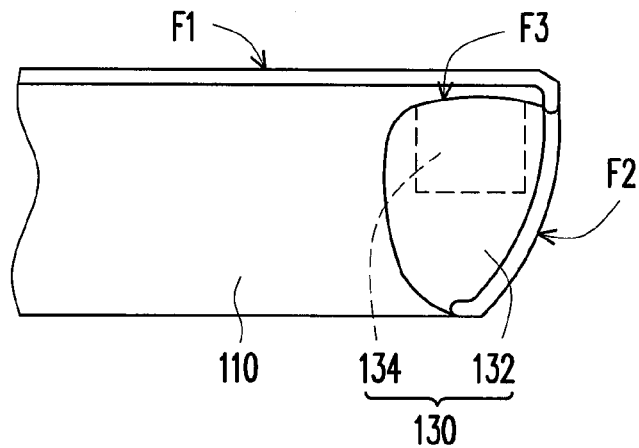
FIG. 3A and FIG. 3B are cross-sectional diagrams respectively illustrating members of a connection port module of the electronic apparatus depicted in FIG. 1 and FIG. 2.
Figure 3B:
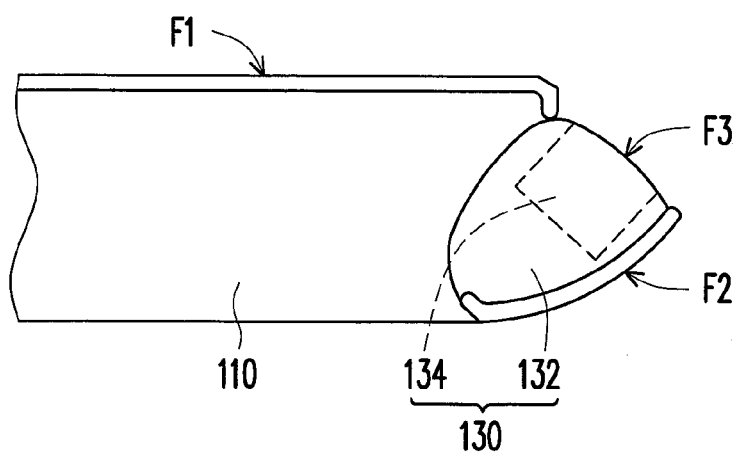

FIG. 3A and FIG. 3B are cross-sectional diagrams respectively illustrating members of a connection port module of the electronic apparatus depicted in FIG. 1 and FIG. 2. Refer to both FIG. 3A and FIG. 3B comparing with FIG. 1 and FIG. 2. To be more specific, the first body 110 has a covering surface F1, which is a surface where the keyboard 112 and touch board 114 are located as shown in FIG. 2. The bearing member 132 of the connection port module 130 has a side surface F2 opposite to the connector 134.

When the second body 120 is closed relative to the first body 110, the second body 120 is stacked on the covering surface F1, and the side surface F2 of the connection port module 130 is exposed from the first body 110 and adjacently connected with the covering surface F1. Namely, the bearing member 132 has an outline matching the first body 110.

Moreover, a side of the bearing member 132 is pivoted to the first body 110, and the connection port module 130 has a connecting surface F3 opposite to the side (i.e. a joint surface of the connector 134). Accordingly, when the second body 120 spreads out relative to the first body 110, the connection port module 130 is driven by the second body 120 to make the bearing member 132 overturn so that the connecting surface F3 of the connection port module is exposed from the first body 110. In the meantime, the connecting surface F3 is substantially adjacently connected between the covering surface F1 and the side surface F2.

Based on the above, the connection port module 130 of the present embodiment can be hidden in or exposed from the first body 110 as the machine bodies 110 and 120 are opened or closed relative to each other. Thus, the connectors 134 can be protected, and additionally, a dust-proofing effect can be achieved without preparing a dust cap when the connection port module 130 is not in use. Meanwhile, the connection port module 134 can be exposed from the first body 110 by overturning the bearing member 132 when the machine bodies 110 and 112 spreads out relative to each other. Accordingly, the user does not need to manually open the dust cap separately, and the convenience of using the electronic apparatus 100 can be enhanced.

Figure 4A:
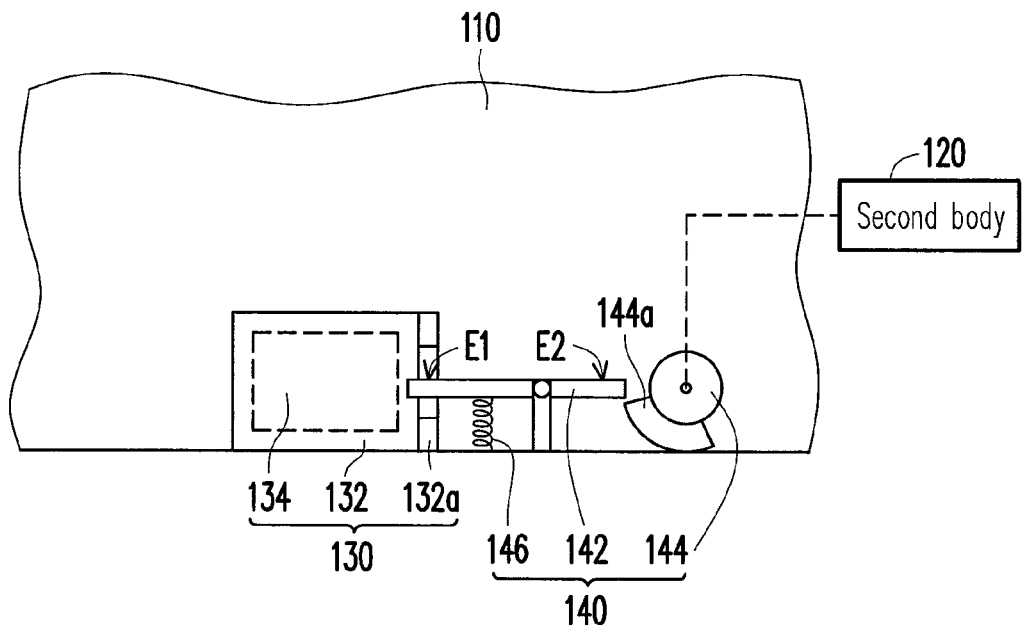
FIG. 4A and FIG. 4B are schematic diagrams respectively illustrating a portion of members of the electronic apparatus depicted in FIG. 2 when machine bodies thereof are opened and closed.
Figure 4B:
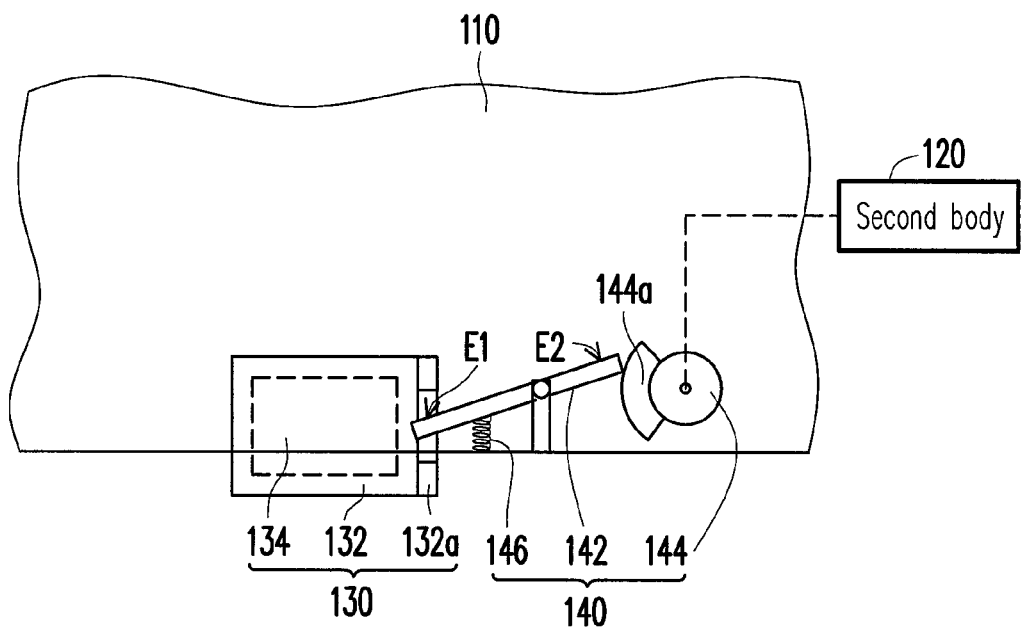

To describe in detail, FIG. 4A and FIG. 4B are schematic diagrams respectively illustrating a portion of members of the electronic apparatus depicted in FIG. 2 when the machine bodies thereof are relatively opened and closed. Referring to FIG. 2, FIG. 4A and FIG. 4B simultaneously, the electronic apparatus 100 further includes a pushing rod module 140 disposed in the first body 110. In the present embodiment, the pushing rod module 140 includes a pushing rod 142 and a cam 144. The pushing rod 142 is pivoted to the first body 110 so as to form a lever structure, and has a first end E1 and a second end E2 located oppositely at either side. The cam 144 is disposed on where the second body 120 is pivoted to the first body 110 so as to rotate as the second body 120 is opened and closed. Moreover, the first end E1 of the pushing rod 142 is coupled to a first pushing portion 132a of the bearing member 132, wherein the first pushing portion 132a is, for example, located at an opening of the bearing member 132 facing toward the second body 120 so that the pushing rod 142 turns the bearing member 132 by getting into the opening via the first end E1. In addition, the cam 144 has a second pushing portion 144a. The second end E2 of the pushing rod 142 is located on a moving path of the second pushing portion 144a.

Accordingly, when the second body 120 spreads out relative to the first body 110, the cam rotates with the second body 120 to allow the second pushing portion 144a to push the second end E2 of the pushing rod 142 so that the first end E1 of the pushing rod 142 drives the first pushing portion 132a, and the bearing member 132 moves relative to the first body 110. Herein, since the bearing member 132 is pivoted to the first body 110, the bearing member 132 is overturned relative to the first body 110 so that the connector 134 is exposed from the first body 110.

Additionally, in the present embodiment, the pushing rod module 140 further includes an elastic member 146 propped against the first end E1 of the pushing rod 142 and the first body 110. When the connector 134 of the connection port module 130 is exposed from the first body 110, the pushing rod 142 also compresses the elastic member 146. Therefore, when the second body 120 is closed relative to the first body 110 (i.e. the pushing rod module 140 is transformed from in a status as shown in FIG. 4A to in another status as shown in FIG. 4B), once the second pushing portion 144a of the cam 144 is released from pushing the second end E2 of the pushing rod 142, the elastic member 146 returns to the status as shown in FIG. 4A by elasticity.

Figure 5A:
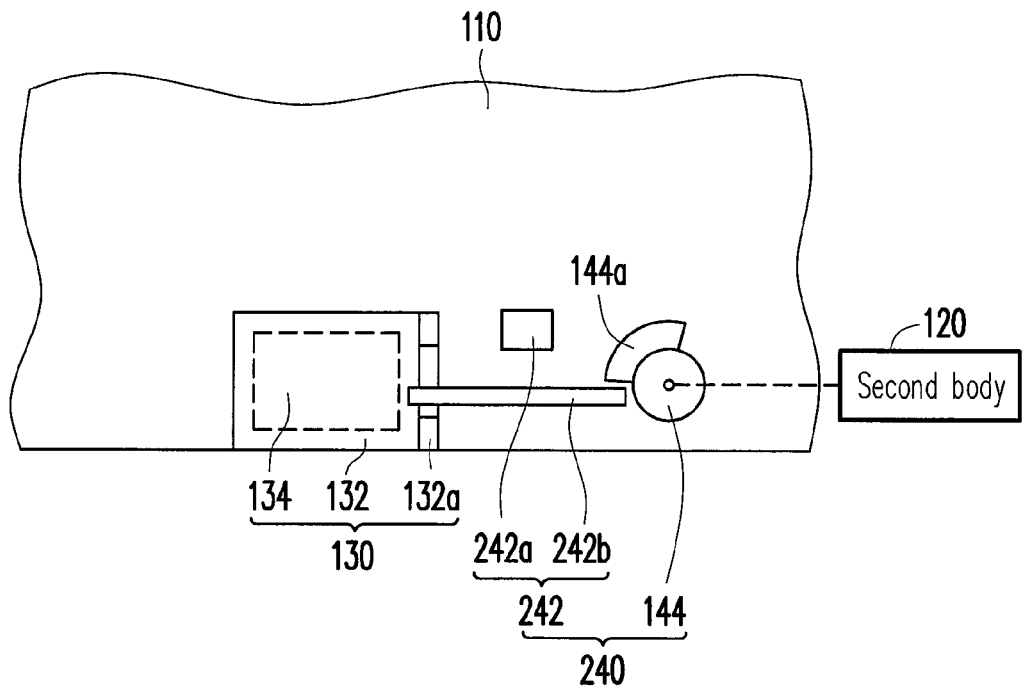
FIG. 5A and FIG. 5B are schematic diagrams illustrating a portion of members of an electronic apparatus according to another embodiment of the invention.
Figure 5B:
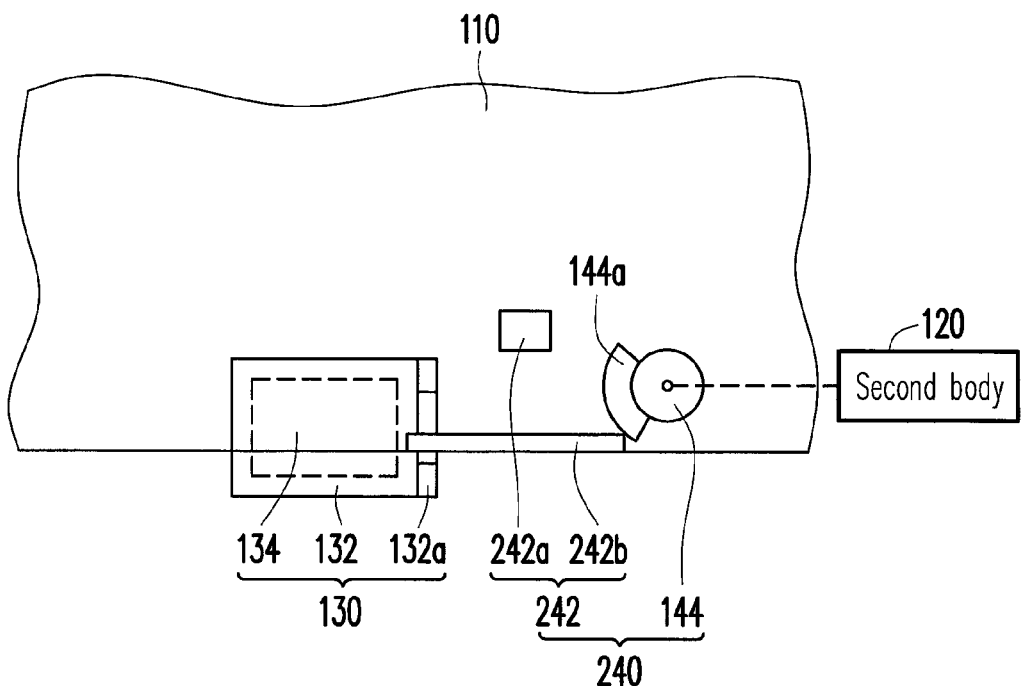

FIG. 5A and FIG. 5B are schematic diagrams illustrating a portion of members of an electronic apparatus according to another embodiment of the invention in comparison with different statuses as shown in FIG. 1 and FIG. 2. Referring to FIG. 5A and FIG. 5B, the major difference from the aforementioned embodiment relies in a pushing rod module 240 of the present embodiment, where a pushing rod 242 is a magnetic dipole structure disposed in the first body. In other words, the pushing rod 242 includes a first member 242a and a second member 242b which are magnetically opposed to each other. The first member 242a is fixed in the first body 110. The second member 242b is slidingly disposed in the first body 110 and has the first end E1 and the second end E2. Similar to the aforementioned embodiment, the second end E2 is located on the moving path of the second pushing portion 144a of the cam 144, and the first end E1 is coupled to the first pushing portion 132a of the bearing member 132. Accordingly, when rotating with the second body 120, the cam 144 drives the second pushing portion 144a to slide relative to the first body 110 so as to drive the bearing member 132 to overturn relative to the first body 110, such that the connector 134 is exposed. When the second body 120 is closed relative to the first body 110, and the cam 144 is released form pushing the second end E2 of the pushing rod 242, the second member 242b returns to where it is initially positioned as shown in FIG. 5A by a magnetic attraction force between the first member 242a and the second member 242b.

In another embodiment that is not illustrated, the first member may also be disposed on a side opposite to the first member 242a shown in FIG. 5A. Under such condition, the first member is magnetically equal to the second member such that the second member may return to where it is initially positioned by a magnetic repulsion force between the two members. Based on the above, the invention is not intent to limit the related structure by which returning the pushing rod is achieved. Namely, any related structure by which the connection port module is turned using the pushing rod so that the connection port module is hidden in or exposed from the machine body can be applied to the invention.

Figure 6A:
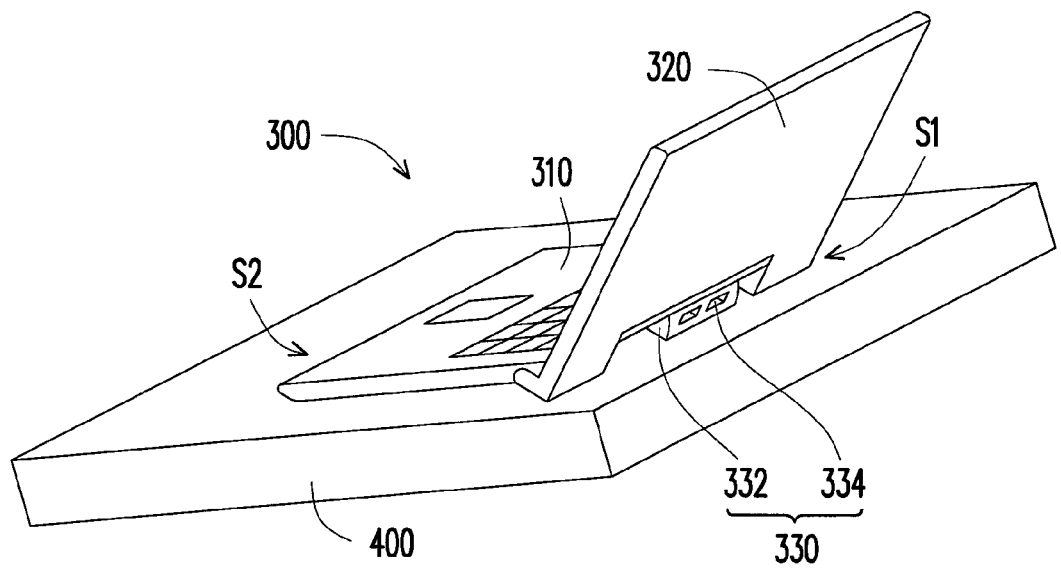
FIG. 6A is a schematic diagram of an electronic apparatus according to still another embodiment of the invention.
Figure 6B:
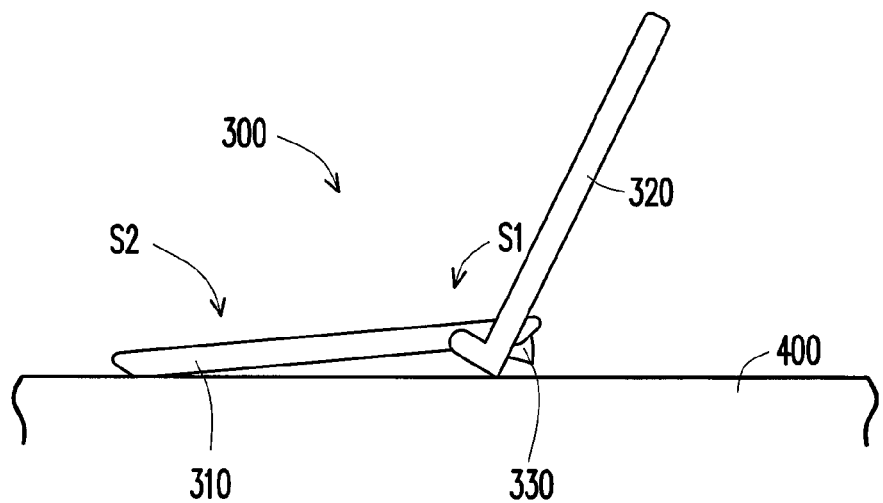
FIG. 6B is a side view of the electronic apparatus depicted in FIG. 6A.
Figure 6C:
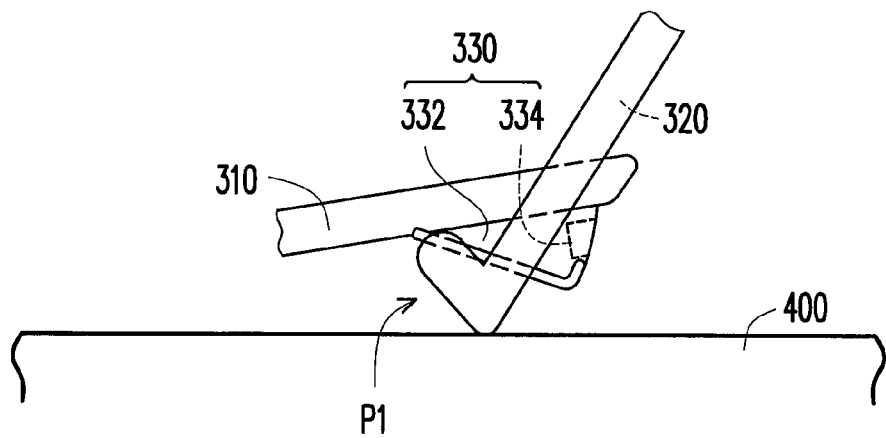
FIG. 6C is a partially enlarged view of FIG. 6B.

FIG. 6A is a schematic diagram of an electronic apparatus according to still another embodiment of the invention. FIG. 6B is a side view of the electronic apparatus depicted in FIG. 6A. FIG. 6C is a partially enlarged view of FIG. 6B. Referring to FIG. 6A through FIG. 6C simultaneously, in the preset embodiment, a first body 310 of an electronic apparatus 300 is adapted to being placed on a platform 400. When a second body 320 spreads out relative to the first body 310, the second body 320 is propped against the platform 400 so that a part of the first body 310 is elevated relative to the platform 400. That is, when the machine bodies 310 and 320 of the electronic apparatus 300 are in a spreading status, there is a space P1 existing between the first body 310 and the platform 400. Thereby, it is convenient for the user to manipulate input modules (referring to the keyboard 112 and the touch board 114 as depicted in FIG. 2), on the first body 310 when using the electronic apparatus 300.

It should be noted that a connection port module 330 of the electronic apparatus 300 is disposed on a back side S1 of the first body 310. It is to be mentioned herein that the aforesaid back side S1 is defined by a status that the user manipulates the electronic apparatus 300, as shown in FIG. 6A, wherein a side near to the user is a front side S2, and a side away from the user is the back side S1. In other words, when the machine bodies 310 and 320 are closed relative to each other, the connection port module 330 of the present embodiment is hidden in the first body 310 and located near where the second body 320 is pivoted to the first body 310.

Further, when the second body 320 spreads out relative to the first body 310, a bearing member 332 of the connection port module 330 is overturned at the back side S1 of the first body 310 so that a connector 334 is exposed from the first body 310 via the back side S1, and the connector 334 is located at the space P1 remained by elevating the first body 310 relative to the platform 400, i.e. the connector 334 is located between the first body 310 and the platform 400.

Figure 7:
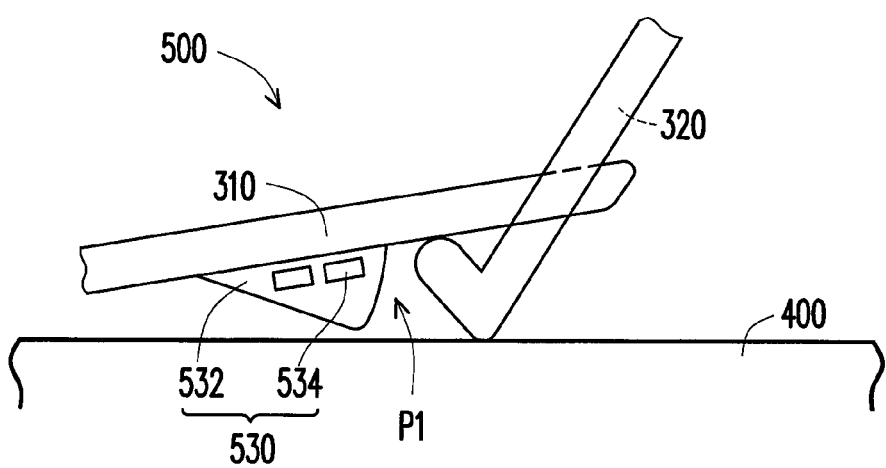
FIG. 7 is a partial side view of an electronic apparatus according to yet another embodiment of the invention.

However, where the connector 334 is exposed from the bearing member 332 is not limited herein. FIG. 7 is a partial side view of an electronic apparatus according to yet another embodiment of the invention. Referring to FIG. 7 together with FIG. 6C, similar to the preceding embodiment, in an electronic apparatus 500 of the present embodiment, a bearing member 532 of a connection port module 530 is disposed on the bottom of the first body 310 so that when the second body 320 spreads out relative to the first body 310, the bearing member 532 is overturned out from the space P1 remained by the second body 320 pushing up the first body 310. However, differing from the preceding embodiment, the connector 534 faces toward to another position different from the back side S1 and the front side S2, such as facing toward to the left or the right of the user, so that the user can directly and conveniently performs connection with external apparatuses by his/her left hand or right hand.

Therefore, by such disposing manner, the first body 310 storing the connection port module 330 can not only have a simple and beautiful appearance, but also having the effect of being lighter and thinner. In addition, the related structure by which the second body 320 drives the connection port module 330 to overturn is similar to the preceding embodiment, and thus, will not be described repeatedly hereinafter.

In view of the foregoing, in the embodiments of the invention, the electronic apparatus drives the connection port module to be hidden in or exposed from the machine body by way of the machine bodies being opened or closed relative to each other. Therein, the connection port module not in use is stored in the machine body when the machine bodies are closed relative to each other, the machine body have a simple appearance, and the connection port module is automatically exposed to the outside from the machine body when the machine bodies are opened relative to each other so that the convenience for operating the electronic apparatus can be enhanced by avoiding manual operation. Furthermore, by spreading the machine bodies to elevate a part thereof and to position the exposed connection port module at the space remained by elevating the machine body, a better space utilization can be achieved. Accordingly, with the aforesaid connection port module as described in the above, the appearance of the electronic apparatus can be beautified and a lighter and thinner effect.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An electronic apparatus, comprising:
a first body;
a second body, pivoted to the first body so that the second body is opened and closed relative to the first body;
a connection port module, movably disposed in the first body and having a first pushing portion, wherein the connection port module comprises a bearing member having a side pivoted to the first body; and
a pushing rod module, disposed in the first body, wherein a first end of the pushing rod module is coupled to the first pushing portion, and a second end of the pushing rod module is coupled to the second body, and when the second body spreads out relative to the first body, the second body drives the first pushing portion by the pushing rod module so that the connection port module is exposed from the first body by moving relative to the first body;
furthermore, the pushing rod turns the bearing member by inserting into the opening of the bearing member via the first end of the pushing rod; and a plurality of connectors disposed on the bearing member.

2. The electronic apparatus according to claim 1, wherein the pushing rod module comprises:
a pushing rod, disposed in the first body and having the first end and the second end; and
a cam, disposed on where the second body is pivoted to the first body so as to rotate as the second body is opened and closed, wherein the cam has a second pushing portion, and the second end of the pushing rod module is located on a moving path of the second pushing portion.

3. The electronic apparatus according to claim 2, wherein the pushing rod is pivoted to the first body to form a lever structure, and the first end and the second end are disposed on two opposite sides of the lever structure.

4. The electronic apparatus according to claim 2, wherein the pushing rod is a magnetic dipole structure disposed in the first body and comprises:
a first member, fixed in the first body; and
a second member, slidingly disposed in the first body and having the first end and the second end, wherein the second member is magnetically equal to or opposite to the first body.

5. The electronic apparatus according to claim 1, wherein the connection port module has a connecting surface, and the bearing member has a side surface, and when the second body is closed relative to the first body, the connecting surface is hidden in the first body, and the side surface is exposed from the first body, and when the second body spreads out relative to the first body, the connecting surface and the side surface are exposed from the first body.

6. The electronic apparatus according to claim 5, wherein the first body has a covering surface, wherein when the second body is closed relative to the first body, the second body is stacked on the covering surface, and the side surface is adjacently connected with the covering surface, and when the second body spreads out relative to the first body, the connecting surface is adjacently connected between the covering surface and the side surface.

7. An electronic apparatus, comprising:
a first body;
a second body, pivoted to the first body so that the second body is opened and closed relative thereto; and
a connection port module, movably disposed in the first body, wherein the connection port module has a bearing member having a side pivoted to the first body and when the second body is opened and closed relative to the first body, the second body drives the connection port module to rotate relative to the first body so that the connection port module is overturned and exposed from the first body, wherein a surface of the connection port module exposed from the first body is different from a surface of the first body covered by the second body when the second body is closed relative to the first body;
a pushing rod module, disposed in the first body and having a first end and a second end, and the bearing member has a first pushing portion, wherein the first end is coupled to the first pushing portion, and the second end is coupled to the second body so that the second body drives the bearing member to rotate by driving the pushing rod module when the second body spreads out relative to the first body;
furthermore, the pushing rod turns the bearing member by inserting into the opening of the bearing member via the first end of the pushing rod; and a plurality of connectors disposed on the bearing member.

8. The electronic apparatus according to claim 7, wherein the connection port module has a connecting surface and the bearing member has a side surface opposite to the plurality of connectors, and when the second body is closed relative to the first body, the second body is stacked on a covering surface of the first body, the connecting surface is hidden in the first body, and the side surface is exposed from the first body and adjacently connected with the covering surface, and when the second body spreads out relative to the first body, the bearing member is overturned relative to the first body so that the connecting surface is exposed from the first body, and the connecting surface is adjacently connected between the covering surface and the side surface.

9. The electronic apparatus according to claim 8, wherein the pushing rod module comprises:
a pushing rod, disposed in the first body and having the first end and the second end; and
a cam, disposed on where the second body is pivoted to the first body so as to rotate as the second body is opened and closed, wherein the cam has a second pushing portion, and the second end of the pushing rod module is located on a moving path of the second pushing portion.

10. The electronic apparatus according to claim 9, wherein the pushing rod is pivoted to the first body to form a lever structure, and the first end and the second end are disposed on two opposite sides of the lever structure.

11. The electronic apparatus according to claim 9, wherein the pushing rod is a magnetic dipole structure disposed in the first body and comprises:
a first member, fixed in the first body; and
a second member, slidingly disposed in the first body and having the first end and the second end, wherein the first member is magnetically equal to or opposite to the second body.

12. The electronic apparatus according to claim 7, wherein the first body is adapted to being placed on a platform, and when the second body spreads out relative to the first body, the second body is propped against the platform so that a part of the first body is elevated relative to the platform, and the connection port module exposed from the first body is located between the first body and the platform.

* * * * *